United States Patent [19]
Jo

[11] Patent Number: 5,773,333
[45] Date of Patent: Jun. 30, 1998

[54] METHOD FOR MANUFACTURING SELF-ALIGNED T-TYPE GATE

[75] Inventor: Jun Whan Jo, Seoul, Rep. of Korea

[73] Assignee: LG Semicon Co., Ltd., Chungcheongbuk-Do, Rep. of Korea

[21] Appl. No.: 781,900

[22] Filed: Dec. 30, 1996

[30] Foreign Application Priority Data

Dec. 30, 1995 [KR] Rep. of Korea ................ 69310/1995

[51] Int. Cl.⁶ ............................................. H01L 21/338
[52] U.S. Cl. ....................... 438/179; 438/182; 438/579
[58] Field of Search ................................ 438/182, 180, 438/179, 579, 578, 577, 576, 574, 573, 575, 581, 582, 670, 336, 337, 338, 339, 951; 148/DIG. 140

[56] References Cited

U.S. PATENT DOCUMENTS

| | | | |
|---|---|---|---|
| 4,353,935 | 10/1982 | Symersky | 438/951 |
| 4,700,462 | 10/1987 | Beaubien et al. | 438/577 |
| 4,731,340 | 3/1988 | Chang et al. | 438/951 |
| 4,767,721 | 8/1988 | Liao et al. | 438/951 |
| 5,032,541 | 7/1991 | Sakamoto et al. | 438/574 |
| 5,338,703 | 8/1994 | Matsuoka | 438/577 |

*Primary Examiner*—Michael Trinh
*Attorney, Agent, or Firm*—John P. White; Cooper & Dunham LLP

[57] ABSTRACT

Method for manufacturing a self-aligned T-type gate in which an ohmic electrode and a T-type gate electrode are simultaneously disposed and its excellent reproductivity is obtained and the overall process is simplified is disclosed, including the steps of: forming an insulating layer, a first metal layer, and a first photoresist layer and patterning the first photoresist layer; selectively removing the first metal layer such that the first metal layer under a pattern of the first photoresist layer is under-cut in a mesa form to form a gate pattern, and selectively removing the insulating layer such that the insulating layer under the first metal layer is under-cut in a same form as the first metal layer so as to pattern ohmic electrode regions; forming a second metal layer on the ohmic electrode regions to form ohmic electrodes and selectively removing the insulating layer to be unsymmetrical with respect to the center of the first metal layer; forming a second photoresist layer on the entire surface inclusive of the first metal layer and selectively removing the second photoresist layer to expose the first metal layer inclusive of one of the ohmic electrodes; forming a third photoresist layer on the entire surface inclusive of the exposed ohmic electrode and exposing a surface of the first metal layer; and removing the first metal layer, selectively removing the insulating layer to form a gate electrode region, and forming a third metal layer on the entire surface to form a T-type gate.

12 Claims, 8 Drawing Sheets

METHOD FOR MANUFACTURING SELF-ALIGNED T-TYPE GATE

BACKGROUND OF THE INVENTION

1. Field of the Invention

The present invention relates to a method for manufacturing a T-type gate, more particularly, to a method for manufacturing a self-aligned T-type gate, in which an ohmic electrode and a T-type gate electrode are provided simultaneously, for improving reproductivity and simplifying the process.

2. Discussion of the Related Art

A method for manufacturing a self-aligned T-type gate is applied to only an enhanced field effect transistor (EFET) by an ion implantation method. To form a T-type gate, a fine alignment is necessary for a process of gold coating. Moreover, another fine alignment is also necessary for forming an ohmic electrode after forming the T-type gate electrode.

A conventional method for manufacturing a self-aligned T-type gate will be discussed with reference to the accompanying drawings.

Figure 1A:
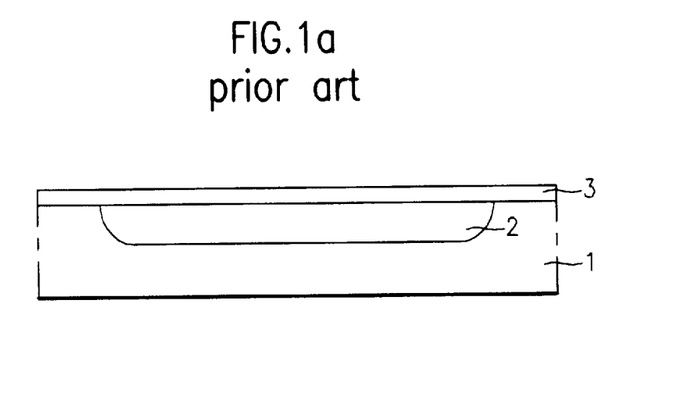
FIGS. 1a to 1l are cross-sectional views showing process steps of a conventional method for manufacturing a self-aligned T-type gate; and, FIGS. 2a to 2j are cross-sectional views showing process steps of a method for manufacturing a self-aligned T-type gate according to a preferred embodiment of the invention.

Referring to FIG. 1a, an n-type well 2 is formed in a p-type semiconductor substrate 1 by implanting $n^-$ impurity ion into the p-type semiconductor substrate 1. Next, a first silicon nitride (SiNx) layer 3 is deposited on the entire surface of the substrate 1 inclusive of the n-type well 2, and then an active layer is formed on the first silicon nitride layer 3 by an annealing treatment. Next, the first silicon nitride layer 3 is removed.

Figure 1B:
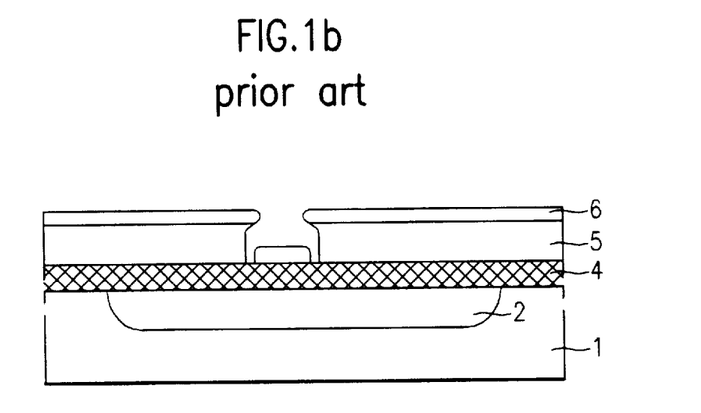

Referring to FIG. 1b, a titanium tungsten nitride (TiWN) layer, which is a thermally-stable, fire-resistant metal layer 4, is deposited on the entire surface of the substrate 3. Then, a first photoresist layer 5 is coated on the fire-resistant layer 4 and then patterned to expose a portion of the fire-resistant layer 4 for the placement of a gate electrode. At this time, the pattern of the first photoresist 5 is made to be overhung. Subsequently, a nickel metal layer 6 is formed on the first photoresist layer 5 inclusive of the exposed portion of the fire-resistant metal layer 4.

Figure 1C:
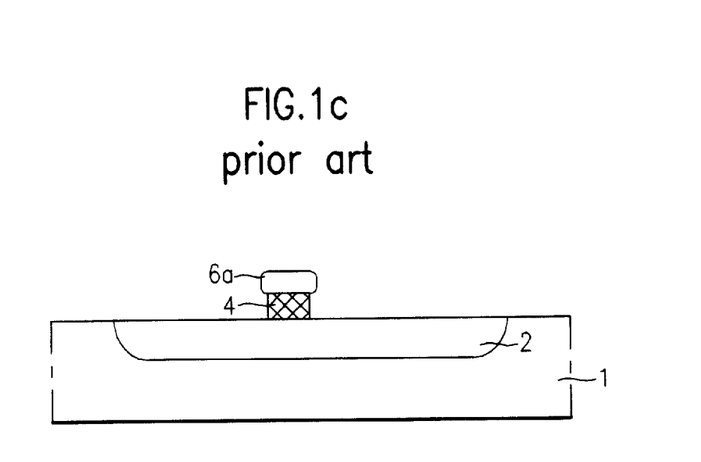

Referring to FIG. 1c, the first photoresist layer 5 and the nickel metal layer 6 thereon are removed by a lift-off method to form a nickel metal pattern mask which will be used in the next process of etching the fire-resistant metal layer 4. Subsequently, the fire-resistant metal layer 4 is etched by a reactive ion etching (RIE) process using $CF_4/O_2$ such the fire-resistant metal layer 4 is under-cut under the nickel metal pattern mark 6a.

Figure 1D:
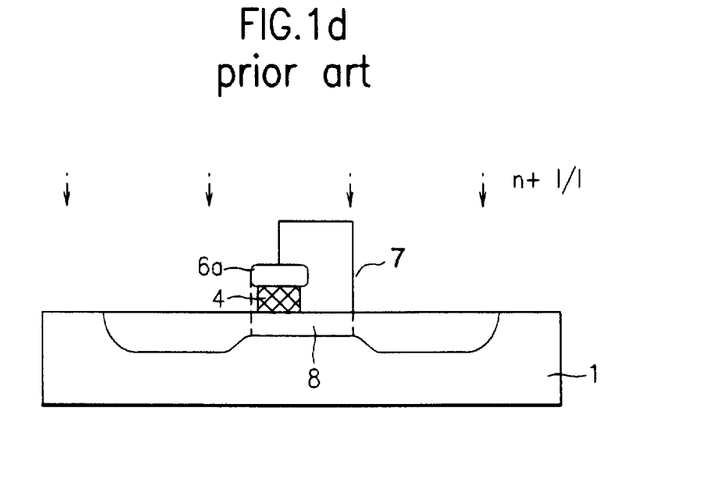

Referring to FIG. 1d, a second photoresist layer 7 is coated on the substrate 1 inclusive of the nickel metal pattern mask 6a, and then patterned for an $n^+$-type impurity ion implantation. At this time, the pattern of the second photoresist layer 7 is formed to be unsymmetrical with respect to the center of the nickel metal pattern mask 6a such that the $n^-$-type impurity ion implantation may be carried out. Subsequently, with the nickel metal pattern mask 6a and the second photoresist layer 7 serving as masks, $n^-$-type impurity ions are implanted into the region of the n-type well 2, thus forming an $n^+$-type impurity diffusion region. At this time, the nickel metal pattern mask 6a is for self-aligned ion implantation of an $n^+$-type impurity.

Figure 1E:
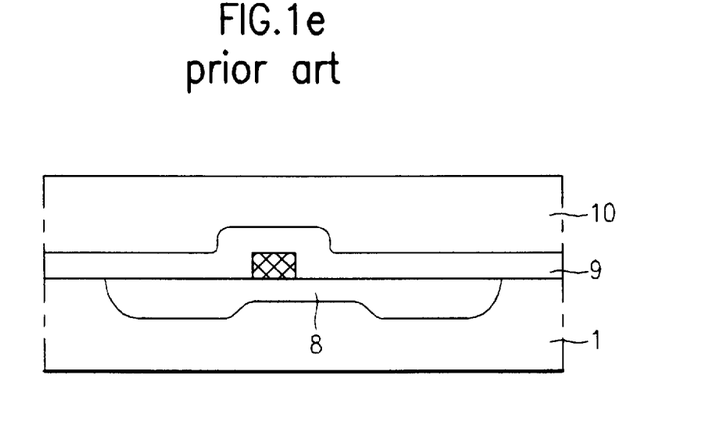

Referring to FIG. 1e, the second photoresist layer 7 and the nickel metal pattern mask 6a are removed. Then, a second silicon nitride layer 9 and a reflowed photoresist layer 10 are sequentially formed on the entire surface of the substrate 1 inclusive of the refractory metal layer 4.

Figure 1F:
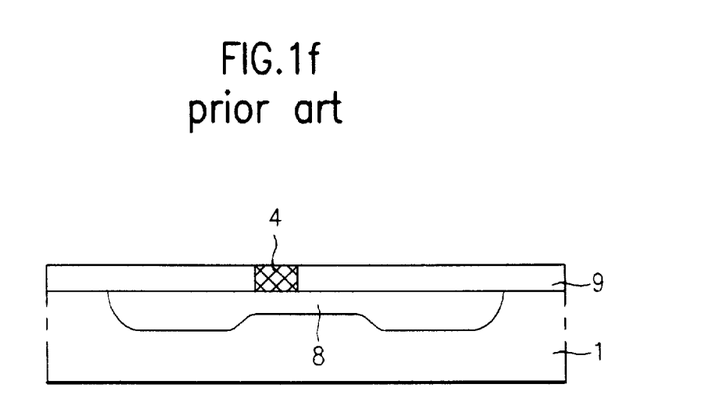

Referring to FIG. 1f, the reflowed photoresist layer 10 and the second silicon nitride layer 9 formed above the refractory metal layer 4 are etched by an RIE using $CF_4/O_2$ such that the refractory metal layer 4 and the second silicon nitride layer 9 are planarized to have a same thickness. In this case, the reflowed photoresist layer 10 is etched by $O_2$ and the second silicon nitride layer 9 firmed above the refractory metal layer 4 is etched by $CF_4$.

Figure 1G:
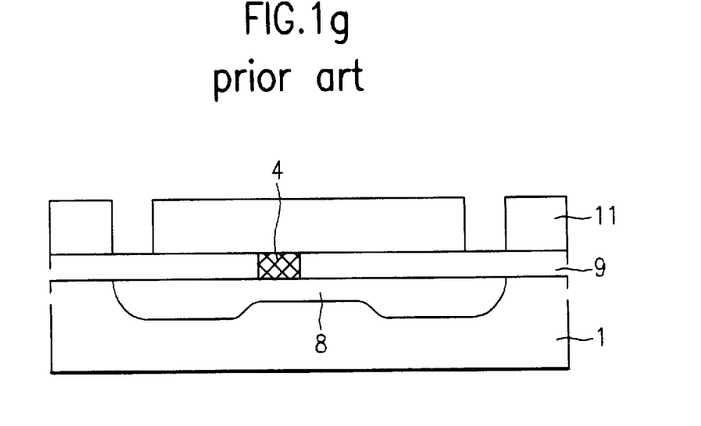

Referring to FIG. 1g, a third photoresist layer 11 is coated on the second silicon nitride layer 9 inclusive of the fire-resistant metal layer 4, and then patterned to define ohmic contact hole regions on predetermined portions of the second silicon nitride layer 9 over the $n^+$-type impurity region 8.

Figure 1H:
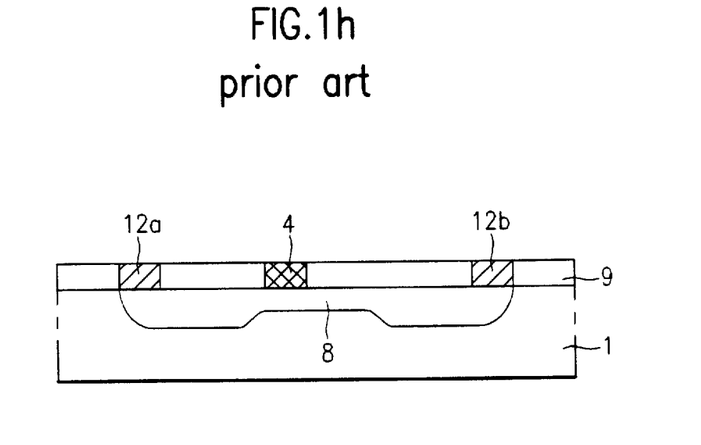

Referring to FIG. 1h, with the third photoresist layer 11 serving as a mask, the second silicon nitride (SiNx) layer 9 is selectively removed by an RIE using $CF_4/O_2$, thus forming ohmic contact holes. Then the ohmic contact holes are buried with an ohmic metal (i.e., AuGe and Ni) so as to form a source electrode 12a and a drain electrode 12b.

Figure 1I:
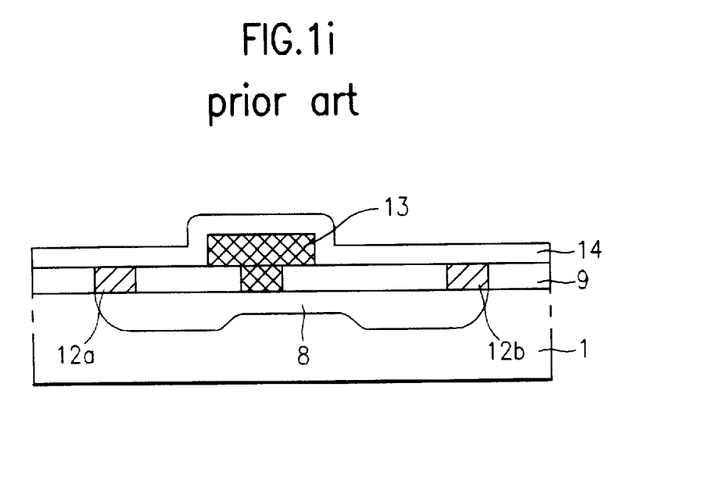

Referring to FIG. 1i, a metal (i.e., Titanium (Ti) and gold (Au)) layer for a gate electrode is formed on the entire surface of the second silicon nitride layer 9 inclusive of the source and drain electrodes 12a and 12b and the refractory metal layer 4. Next, the unnecessary metal layer made of Ti and Au is removed to form a T-type gate 13. Then, as a protecting film, a third silicon nitride (SiNx) layer 14 is formed on the entire surface of the second silicon nitride layer 9 inclusive of the T-type gate 13.

Figure 1J:
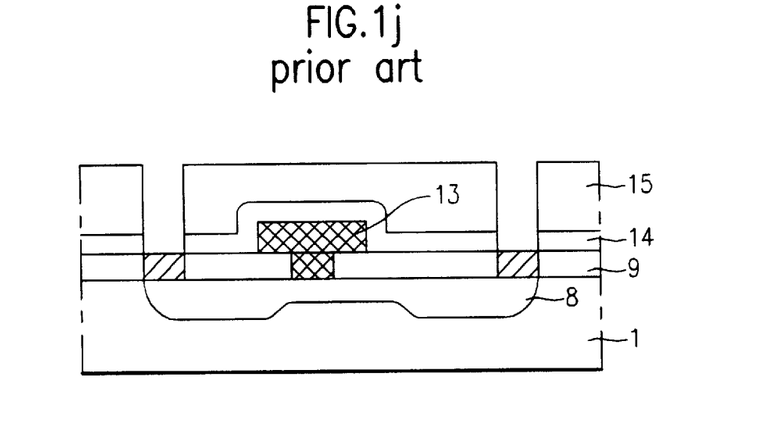

Referring to FIG. 1j, a fourth photoresist layer 15 is coated on the third silicon nitride layer 14, and then the fourth photoresist layer 15 over the source/drain electrodes 12a and 12b is subjected to exposure and development to be patterned. Next, with the fourth photoresist layer 5 serving as a mask, the third silicon nitride layer 14 on the source/drain electrodes 12a and 12b is selectively removed by an RIE using $CF_4/O_2$. Thereafter, the remaining fourth photoresist layer 15 is removed by an RIE using acetone or $O_2$.

Figure 1K:
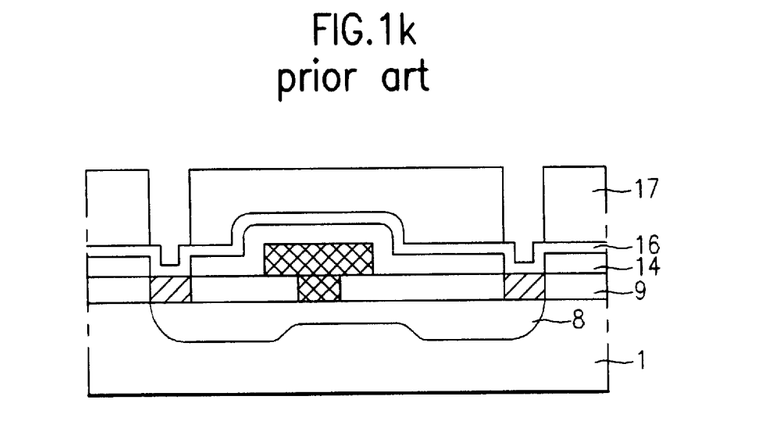

Referring to FIG. 1k, on the entire surface of the third silicon nitride layer 14 inclusive of the source/drain electrodes 12a and 12b, there is formed a titanium tungsten nitride (TiWN) 16 for base metal electrodes needed in gold-coating, by employing a reactive sputtering method.

Figure 1L:
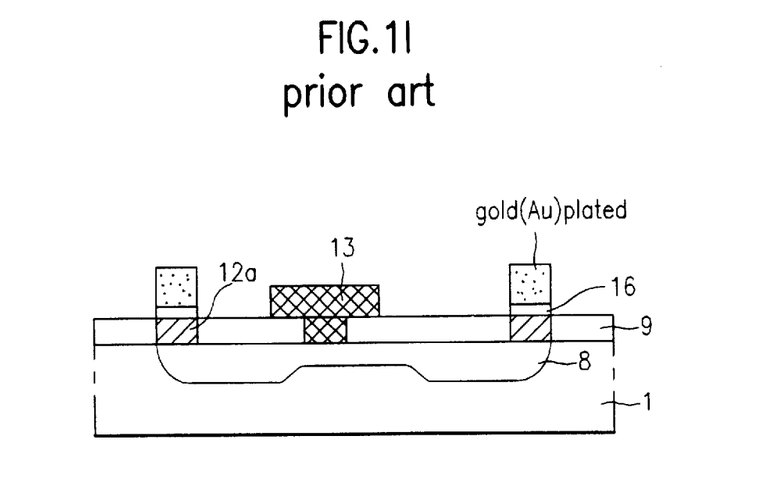

Subsequently, as shown in FIG. 1l, a fifth photoresist layer 17 is coated on the TiWN layer 16. Then, the fifth photoresist layer 17 is patterned for placements of gold-coating. Next, with the pattern of the fifth photoresist layer 17 serving as a mask, the gold-coating is performed. Subsequently, the pattern of the fifth photoresist layer 17 is removed by an RIE using $CF_4/O_2$, thereby completing the conventional self-aligned T-type gate.

The conventional method for manufacturing a self-aligned T-type gate has disadvantages. A fine alignment process is necessary for formations of a T-type gate and another fine alignment process is also necessary for formation of ohmic contacts (source/drain electrodes). That is, the overall process is complicated. Moreover, the method can be applied to only an EFET using an ion implantation technique and its reproductivity is poor.

SUMMARY OF THE INVENTION

Therefore, the present invention is directed to a method for manufacturing a self-aligned T-type gate that substantially obviates one or more of problems due to limitations and disadvantages of the related art.

An object of the invention is to provide a method for manufacturing a self-aligned T-type gate in which an ohmic electrode and the T-type gate electrode are simultaneously disposed and in which its excellent reproductivity can be obtained and the overall process simplified.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a self-aligned T-type gate includes the steps of: forming an insulating layer, a first metal layer, and a first photoresist layer and patterning the first photoresist layer; selectively removing the first metal layer such that the first metal layer under a pattern of the first photoresist layer is under-cut in a mesa form to form a gate pattern, and selectively removing the insulating layer such that the insulating layer under the first metal layer is under-cut in a same form as the first metal layer so as to pattern ohmic electrode regions; forming a second metal layer on the ohmic electrode regions to form ohmic electrodes and selectively removing the insulating layer to be unsymmetrical with respect to the center of the first metal layer; forming a second photoresist layer on the entire surface inclusive of the first metal layer and selectively removing the second photoresist layer to expose the first metal layer inclusive of one of the ohmic electrodes; forming a third photoresist layer on the entire surface inclusive of the exposed ohmic electrode and exposing a surface of the first metal layer; and removing the first metal layer, selectively removing the insulating layer to form a gate electrode region, and forming a third metal layer on the entire surface to form a T-type gate.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present Invention, examples of which are illustrated in the accompanying drawings.

FIGS. 2a to 2j are cross-sectional views showing a method for manufacturing a self-aligned T-type gate.

Figure 2A:
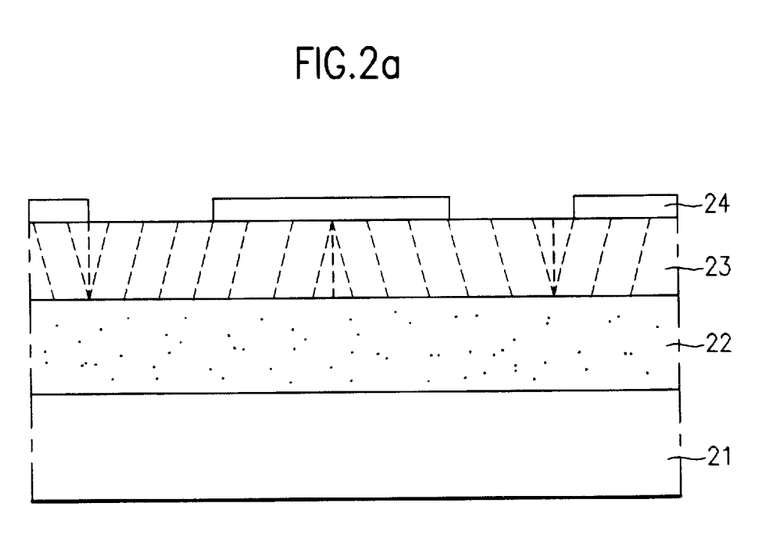

Referring initially to FIG. 2a, a silicon nitride layer 22 and an aluminum metal layer 23 are successively formed on a gallium arsenide (GaAs) substrate 21. Then, a first photoresist layer 24 is coated on the aluminum metal layer 23 and then subjected to exposure and development to define an ohmic electrode region and a gate electrode region. At this time, the aluminum metal layer 23 has a big etching selectivity with the silicon nitride layer 22.

Figure 2B:
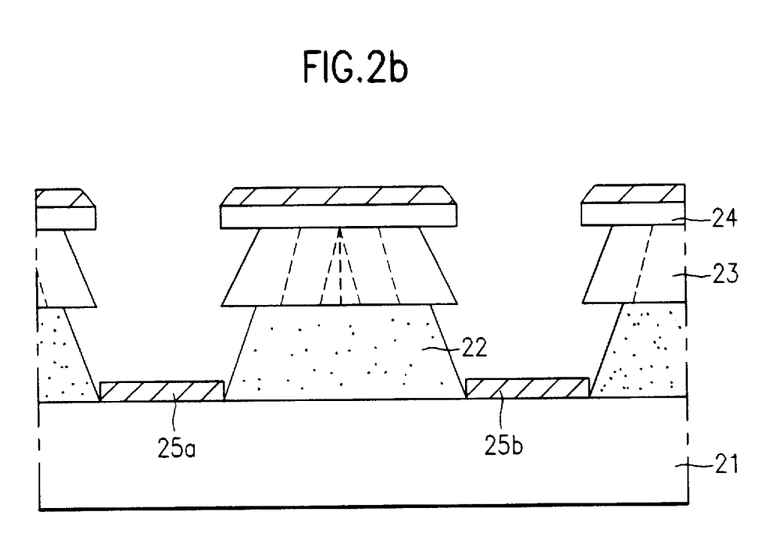

Secondly, as shown in FIG. 2b, the aluminum metal layer 23 is etched by an RIE or a plasma etching using a chlorine gas system such that the aluminum metal layer 23 under the first photoresist layer 24 is under-cut. Thereafter, the silicon nitride layer 22 is dry-etched by using a $CF_4$ gas system of a big etching selectivity with the aluminum metal layer 23 such that the silicon nitride layer 22 under the aluminum metal layer 23 is under-cut, thus exposing predetermined portions of thee substrate 21. At this time, by employing an electron cyclotron resonance (ECR), for example, plasma damage can be decreased, when the dry-etch is performed. The form of a T-type gate depends on the etching form of the aluminum metal layer 23.

Subsequently, a metal layer made of AuGe, nickel (Ni), and Au, used as an ohmic electrode is formed on the entire surface inclusive of the photoresist layer 24 such that a source electrode and a drain electrode are formed on the exposed portions of the substrate 21.

Figure 2C:
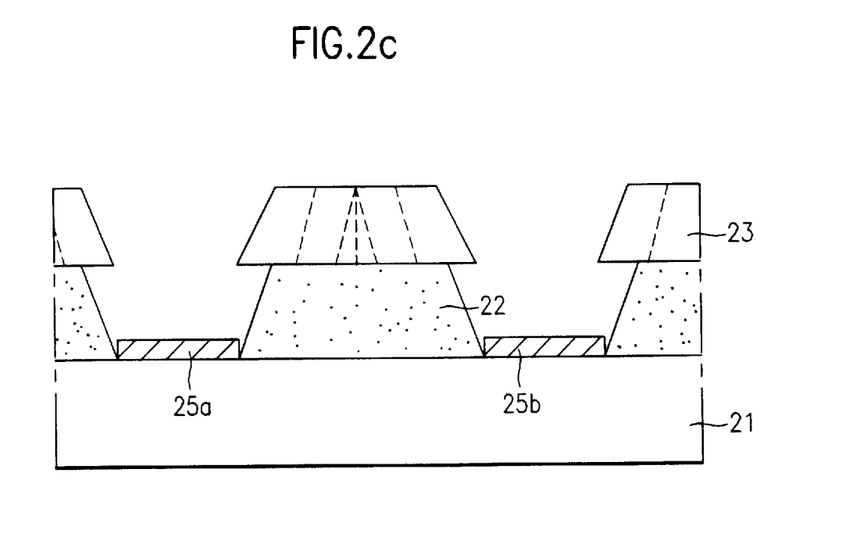

Thereafter, as shown in FIG. 2c, the first photoresist layer 24 and the metal layer on the first photoresist layer 24 are removed.

Figure 2D:
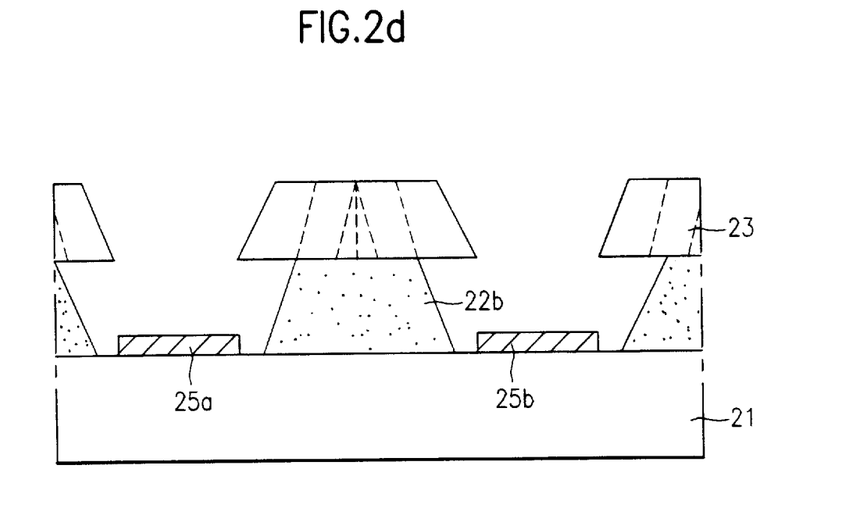

Next, as shown in FIG. 2d, with the remaining aluminum metal layer 23 serving as a mask, the silicon nitride layer 22 under the aluminum metal layer 23 is again under-cut by a plasma etching process employing a $CF_4$ gas system. At this time, in comparison with an RIE process, the plasma etching process decreases damage caused by the collision of the plasma ions.

Figure 2E:
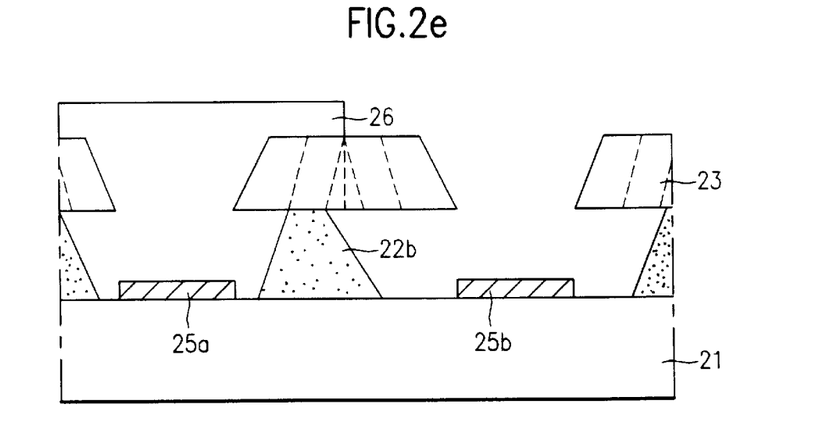

Then, as shown in FIG. 2e, a second photoresist layer 26 is coated on the entire surface inclusive of the substrate 21 and then patterned to expose the drain electrode 25b and predetermined portions of the aluminum metal layer 23 at both sides of the drain electrode 25b. Next, with the second photoresist layer 26 serving as a mask, the silicon nitride layer 22 is dry-etched such that only the silicon nitride layer 22 at surrounding area of the drain electrode 25b is etched. As a result, the pattern of the silicon nitride layer 22b is formed to be unsymmetrical with respect to the center of the aluminum metal layer 23 in the middle. At this time, a gate length and a distance between the source and the gate are determined and thus any fine alignment for the silicon nitride layer pattern is not necessary.

Figure 2F:
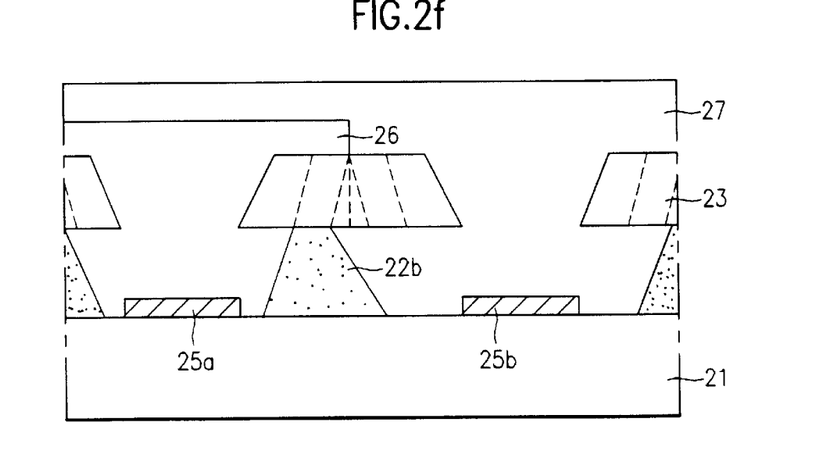

Referring to FIG. 2f, a third photoresist layer 27 is coated on the entire surface inclusive of the second photoresist layer 26. Then, the second and third photoresist layers 26 and 27 are removed by an RIE process using $O_2$ until the surface of the aluminum metal layer 23 is exposed.

Figure 2G:
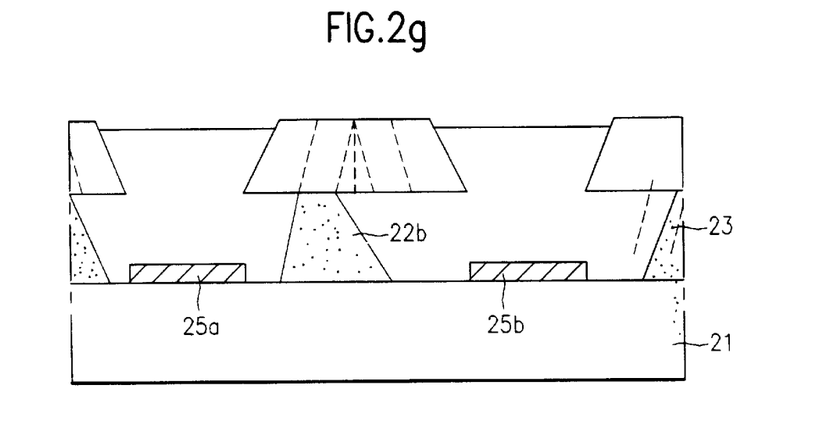
Figure 2H:
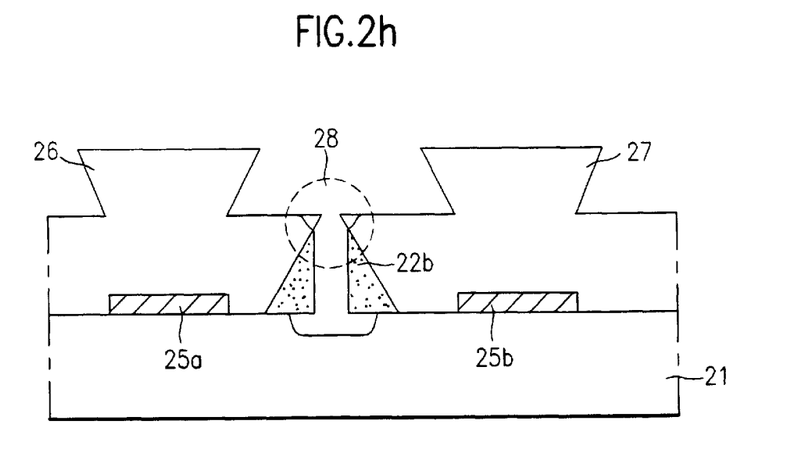

Referring to FIG. 2g, the exposed aluminum metal layer 23 is dry-etched by employing a chlorine gas system. Next, the silicon nitride layer 22 is anisotropically dry-etched by employing $CF_4$, thus forming a gate pattern, as shown in FIG. 2h. With the gate pattern serving as a mask, the substrate is etched by a predetermined depth by employing a dry etch or a wet etch, so that a gate recess is formed. In this case, though the anisotropic etching is applied to the silicon nitride layer 22, the upper portions of the silicon nitride layer 22 are formed to have a round form by means of a fine horizontal etching (anisotropic etching) element.

Figure 2I:
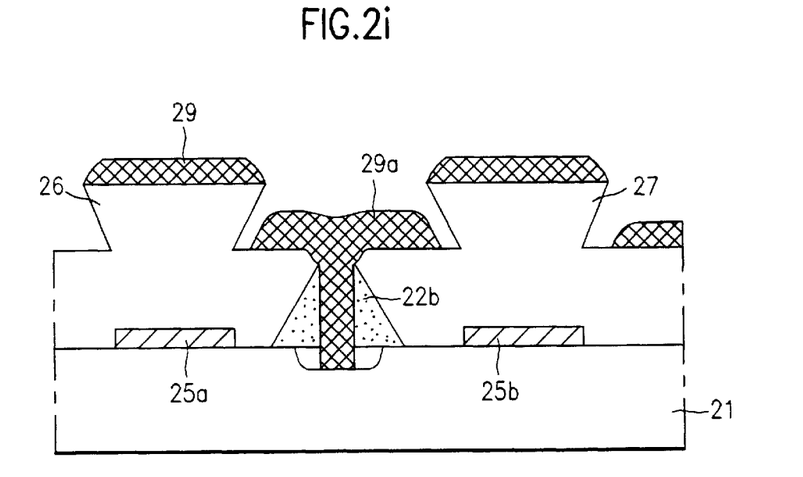

Referring to FIG. 2i, the sharp portions of the second and third photoresist layers 26 and 27 are removed by a plasma etching process using $O_2$, and then a metal (made of any one of Ti, Pt, and Au) layer 29 for a gate electrode is formed to form a gate electrode 29a.

Figure 2J:
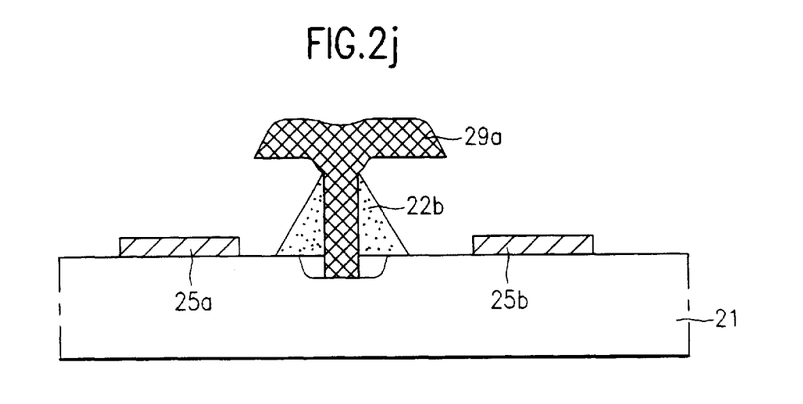

Referring to FIG. 2j, the unnecessary second and third photoresist layers 26 and 27 and the metal layer 29 thereon are removed by lift-off, thereby completing the self-aligned T-type gate of the invention.

If the step shown in FIG. 2e is omitted, that is to say, if the silicon nitride layer isn't unsymmetrical with regard to the aluminum metal layer, the method of the invention can be applied to a manufacture of an FET for a digital IC in which any high breakdown voltage isn't desirable.

The method of the invention has the following advantages.

First, since an ohmic electrode and a gate electrode are simultaneously for med, the overall process is simplified. Second, any fine alignment is unnecessary for the formation of the ohmic electrode and the gate electrode. Third, the method of the invention can be widely applied to a manufacture of a FET using a gate recess etching technique, and an excellent reproductivity can be achieved.

It will be apparent to those skilled in the art that various modifications and variations can be made in the method for manufacturing a self-aligned T-type gate of the present invention without departing from the spirit or scope of the inventions. Thus, it is intended that the present invention cover the modifications and vacations of this invention provided they come within the scope of the appended claims and their equivalents.

What is claimed is:

1. A method for manufacturing a self-aligned T-type gate, the method comprising the steps of:

(1) forming an insulating layer, a first metal layer, and a first photoresist layer, and patterning the first photoresist layer;

(2) selectively removing the first metal layer such that the first metal layer under the first photoresist pattern is under-cut cut in a mesa form to form a gate pattern, and selectively removing the insulating layer such that the insulating layer under the first metal layer is under-cut in the same form as the first metal layer so as to pattern ohmic electrode regions;

(3) forming a second metal layer on the ohmic electrode regions to form ohmic electrodes and selectively removing the insulating layer to be unsymmetrical with respect to the center of the first metal layer;

(4) forming a second photoresist layer on the entire surface inclusive of the first metal layer and selectively removing the second photoresist layer to expose the first metal layer inclusive of one of the ohmic electrodes;

(5) forming a third photoresist layer on the entire surface inclusive of the exposed ohmic electrode, and exposing a surface of the first metal layer; and, (6) removing the first metal layer, selectively removing the insulating layer under the first metal layer to form a gate electrode region, and forming a third metal layer on the entire surface to form a T-type gate.

2. The method as claimed in claim 1, wherein an etching selectivity of said insulating layer is different from that of said first metal layer.

3. The method as claimed in claim 1, wherein said first metal layer for the formation of the gate pattern is etched by employing a gas of a chlorine system.

4. The method as claimed in claim 1, wherein a gas of a $CF_4$ system is employed to etch the insulating layer for the formation of the ohmic electrode regions.

5. The method as claimed in claim 1, wherein, when the insulating layer is etched, an electron cyclotron resonance (ECR) equipment is utilized to decrease plasma damage.

6. The method as claimed is claim 1, wherein said second metal layer is made of one of AuGe, nickel (Ni), and gold (Au).

7. The method as claimed in claim 1, wherein the (6) step includes the steps of:

removing the second photoresist layer until the surface of the first metal layer is exposed;

removing the first metal layer, dry-etching the insulating layer, and removing the substrate by a predetermined depth by dry-etch and wet-etch; and, removing sharp portions of the second and third photoresist layers and forming the third metal layer for the T-type gate.

8. The method as claimed in claim 1, wherein said third metal layer is made of any one of titanium (Ti), platinum (Pt), and gold (Au).

9. The method as claimed in claim 1, wherein said insulating layer is patterned to be unsymmetrical with respect to the center of the first metal layer.

10. The method as claimed in claim 1, wherein said second photoresist layer is removed by an RIE process employing $O_2$.

11. The method as claimed in claim 4, wherein, when the insulating layer is etched, an electron cyclotron resonance (ECR) equipment is utilized to decrease plasma damage.

12. The method as claimed in claim 7, wherein said second photoresist layer is removed by an RIE process employing $O_2$.

* * * * *